United States Patent
Arai et al.

[11] Patent Number: 6,089,966
[45] Date of Patent: Jul. 18, 2000

[54] SURFACE POLISHING PAD

[76] Inventors: Hatsuyuki Arai; Xu Jin Wang, both of 2647, Hayakawa, Ayase-shi, Japan

[21] Appl. No.: 09/193,882

[22] Filed: Nov. 18, 1998

[30] Foreign Application Priority Data

Nov. 25, 1997 [JP] Japan .................................. 9-339443

[51] Int. Cl.⁷ .................................................. B24D 17/00
[52] U.S. Cl. ............................................ 451/533; 451/921
[58] Field of Search .................................... 451/527, 533, 451/534, 537, 529, 921

[56] References Cited

U.S. PATENT DOCUMENTS

| | | | |
|---|---|---|---|
| 3,609,925 | 10/1971 | Comella-Riera | 451/534 |
| 5,212,910 | 5/1993 | Breivogel et al. | 451/287 |
| 5,257,478 | 11/1993 | Hyde et al. | 451/287 |
| 5,310,455 | 5/1994 | Pasch et al. | 451/287 |
| 5,564,965 | 10/1996 | Tanaka et al. | 451/526 |
| 5,876,269 | 3/1999 | Torii | 451/59 |

*Primary Examiner*—Robert A. Rose
*Attorney, Agent, or Firm*—Snell & Wilmer, L.L.P.

[57] ABSTRACT

The present invention provides a polishing pad having a double-layer structure that allows a polishing liquid to permeate evenly throughout the pad while enabling a wafer to be evenly polished up to the neighborhood of its outer circumference.

A polishing pad consists of a hard upper-layer member 11 having a lower compression rate and consisting of a material into which a polishing liquid can permeate, a soft lower-layer member 12 having a higher compression rate and consisting of a material into which a polishing liquid can permeate, and an adhesive layer 13 interposed between both members to adhere them together, wherein a plurality of narrow grooves 14 for facilitating the permeation of polishing liquid into the lower-layer member 12 and partitioning the surface of the pad into a plurality of small regions 15 that can be locally deformed are cut in the pad surface at such an interval that the maximum length of one side of the small region is 10 mm or less and that groove depth is at least half or more the thickness of the upper-layer member.

5 Claims, 3 Drawing Sheets

SURFACE POLISHING PAD

FIELD OF THE INVENTION

The present invention relates to a pad used to polish the surface of a semiconductor wafer, and in particular, to a pad of a double-layer structure suitable for mechanochemical polishing of such wafers.

PRIOR ART

In recent years, with the increased integration and density of semiconductor devices, more and more devices having laminated structures have been manufactured, leading to a demand for techniques for precisely flattening the surface of an insulating protective film provided on the top surface of a laminated structure.

One such technique for flattening wafers is mechanochemical polishing. Under this technique, a wafer held by a retainer is pressed against a polishing pad stuck to a rotating surface plate; the pad is then used to polish the surface of the wafer while a chemical polishing liquid is supplied. During such polishing, if a hard pad of a lower compression rate is used, the surface of the pad becomes unlikely to be deformed and hence the resulting flatness of the wafer surface is improved; however, insufficient adhesion between the pad and wafer can hinder uniform polishing of the entire wafer. By contrast, if a soft pad of a higher compression rate is used, adhesion between the pad and wafer will be sufficient to improve uniformity, but the pad will be prone to deformation and hence the wafer's surface flatness will suffer.

Thus, as shown in FIG. 5, a polishing pad 1 of a double structure can be employed, in which a hard upper-layer member 2 and a soft lower-layer member 3 are adhered together using an adhesive layer 4 such as a tape. This polishing pad 1 is configured so as to improve the flatness and uniformity of the polished wafer, by combining a hard and a soft pad together.

In the conventional two-layer polishing pad 1, however, non-uniform permeation of the polishing liquid may reduce polishing accuracy. That is, in the above polishing pad 1, the polishing liquid permeates into the lower-layer member 3 through the outer circumferential surface but cannot permeate easily therein through the top surface covered by the upper-layer member 2. Thus, permeation of the polishing liquid leads to differing compression rates between the outer circumference of the lower-layer member 3 and its center, thereby reducing polishing accuracy, particularly in terms of uniformity. Thus, it would be desirable if a polishing pad of a double structure enabling polishing liquid to permeate evenly could be made available.

In some conventional polishing pads, a plurality of grooves 5 are cut in the pad surface, using a lattice-like formation, in order to preclude a wafer from being sucked in by the pad surface during polishing and jumping out from the retainer, as shown by the chain line in FIG. 5. Due to their very small depth and large interval, however, the grooves 5 do not allow the polishing liquid to permeate into the lower-layer member 3.

In addition, a wafer, the surface of which has been polished as described above, is divided into a plurality of chips. Since wafers are very expensive, however, it is important to improve chip yields as much as possible by using wafers to the maximum, including the neighborhood of the outer circumference. In general, however, the surface of a wafer W has a distribution of film thickness such as that shown in FIG. 7, with film thickness greater in areas approximately 5 mm from the outer circumference. This outer circumferential portion is called an "edge-exclusion" zone 6 and cannot be used, thereby reducing chip yields. Thus, if the length of the thicker portion can be reduced even by 1 mm, the edge-exclusion zone 6 becomes correspondingly smaller and chip yields rise. Due to the high price of wafers, such reduction has significant economic effects.

One of the factors preventing uniform thickness from being obtained at the outer circumferential portion of the wafer is considered to be the polishing pad. That is, as shown in FIG. 6, when a polishing pad 1 having two layers is compressed by a wafer W during polishing, the pad surface becomes deformed—taking on a curved shape—at the outer circumferential portion. The degree of compression varies continuously from maximum compression to non-compression outward from the center of the pad, and certain portions of the pad are stretched or contracted in the direction of the wafer surface. Consequently, the contact pressure of the pad 1 applied to the wafer W gradually decreases as the distance from the wafer center increases. As a result, the outer circumferential portion of the wafer is insufficiently polished, resulting in the distribution of film thickness 7 shown in FIG. 7.

Through active research into the nature of double-layer pads, the inventor has found that deep and narrow grooves can be cut into the pad surface at small intervals to allow polishing liquid to permeate evenly into the lower-layer member through the narrow grooves as well as to allow small regions partitioned by the narrow grooves to be locally deformed in order to evenly polish a wafer up to the neighborhood of its outer circumference. As a result, the current invention has been proposed.

DISCLOSURE OF THE INVENTION

It is a technical object of this invention to provide a polishing pad of a double-layer structure that allows a polishing liquid to permeate evenly throughout the pad while enabling a wafer to be evenly polished up to the neighborhood of its outer circumference.

To achieve this object, this invention provides a polishing pad formed of a hard upper-layer member having a lower compression rate and consisting of a material into which a polishing liquid can permeate, a soft lower-layer member having a higher compression rate and consisting of a material into which a polishing liquid can permeate, and an adhesive layer interposed between the two members to adhere them together, wherein a plurality of narrow grooves for facilitating the permeation of polishing liquid into the lower-layer member and partitioning the surface of the pad into a plurality of small regions that can be locally deformed are cut in the pad surface at such an interval that the maximum length of one side of the small region is 10 mm or less and such that groove depth is at least half or more of the thickness of the upper-layer member.

In the polishing pad of this configuration, narrow grooves of a depth half or more the thickness of the surface-layer member are cut in the pad surface, thereby allowing a polishing liquid to permeate easily into the lower-layer member through these narrow grooves. Consequently, the polishing liquid permeates evenly and promptly throughout the pad to avoid any local differences in compressibility caused by the non-uniform permeation of the polishing liquid; as a result, polishing accuracy is improved.

In addition, the narrow grooves allow the pad surface to be partitioned into a plurality of small regions in which one side of each region has a maximum length of 10 mm or less, thereby allowing these small regions to be locally deformed without mutual interference. Accordingly, when a wafer is pressed against the pad surface, the portion of the small regions that contacts the wafer is locally compressed without interference from other portions and is able to apply even contact pressure to the overall wafer. Thus, the wafer is evenly polished up to its outer circumferential portion, leaving a thicker portion only within a small area close to the outer circumference; as a result, the size of the edge-exclusion zone is decreased and chip yields rise.

According to this invention, the narrow grooves are preferably cut in such a way as to reach the adhesive layer or to extend down to immediately above this layer, and more preferably to reach the lower-layer member. This configuration allows the polishing liquid to permeate into the lower-layer member more appropriately.

According to one specific embodiment, the pad surface is partitioned into small rectangular regions by cutting the narrow grooves like a lattice.

According to one specific embodiment, the pad surface is partitioned into small fan-shaped regions by cutting the narrow grooves radially and concentrically.

According to this invention, the adhesive layer is preferably formed of a urethane or epoxy adhesive.

DETAILED DESCRIPTION

Figure 1:
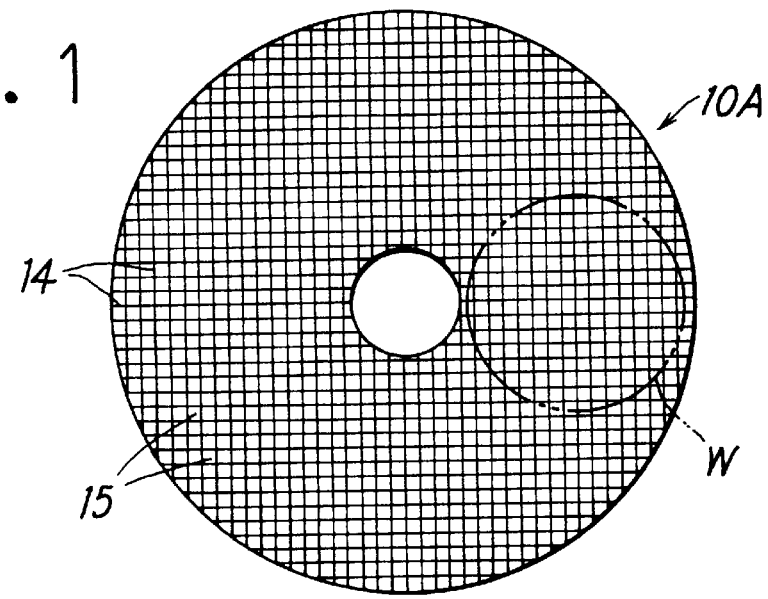
FIG. 1 is a top view showing a first embodiment of a polishing pad according to this invention.
Figure 2:
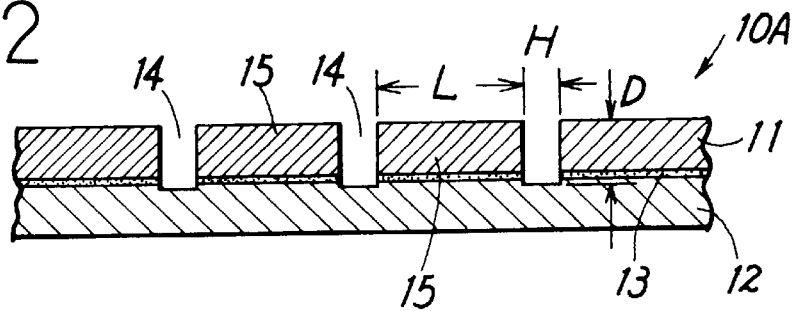
FIG. 2 is an enlarged sectional view of an integral part of FIG. 1

FIG. 1 is a top view showing a first embodiment of a polishing pad according to this invention. A pad 10A is formed of a hard upper-layer member 11 having a lower compression rate and consisting of a material into which a polishing liquid can permeate, a soft lower-layer member 12 having a higher compression rate and consisting of a material into which a polishing liquid can permeate, and an adhesive layer 13 interposed between both members 11 and 12 to adhere them together. In addition, narrow grooves 14 for facilitating the permeation of polishing liquid into the lower-layer member 12 and partitioning the surface of the pad 10A into a plurality of small regions 15 that can be locally deformed are cut all over the pad surface at specified intervals, to form a lattice-like structure.

To allow a polishing liquid to flow in and permeate appropriately without degrading the nature of the pad surface, the width H of the narrow groove 14 is preferably between 0.5 and 1.5 mm and more preferably about 1 mm. In addition, the preferable depth D of the narrow groove 14 is half or more the thickness of the upper-layer member 11 and more preferably, the grooves are cut in such a way as to reach at least the adhesive layer 13 or to extend down to immediately above this layer. In the illustrated example, the grooves are cut in such a way as to extend beyond the upper-layer member 11 and adhesive layer 13 and to reach the lower-layer member 12. Cutting the narrow grooves 14 down to such a depth allows a polishing liquid to permeate into the lower-layer member appropriately while also allowing such liquid to be retained appropriately by preventing it from flowing out in the outer circumferential direction immediately after the surface plate begins to rotate.

The vertical and horizontal pitches of the narrow grooves 14 should be determined so that small regions 15 partitioned among these narrow grooves can be locally deformed and so that the regions have appropriate flexibility and rigidity. A preferable pitch meeting this condition is achieved by setting the length L of one side of each small region 15 between about 3 and 10 mm, and more preferably, between 4 and 7 mm. If the regions 15 are excessively large, they cannot be locally deformed appropriately or provide a required flexibility, whereas if they are excessively small, they become too soft and cut easily upon contact with a wafer.

In addition, the adhesive layer 13 may comprise a pressure sensitive double-coated tape, but preferably comprises, for example, an epoxy or urethane adhesive that can withstand alkali, acid, and heat—due to the alkalinity or acid of the polishing liquid used.

Furthermore, the upper-layer member 11 preferably comprises a pad of, for example, a hard polyurethane foaming body (IC1000 manufactured by Rodel, Inc.), and the lower-layer member 12 preferably comprises a polishing cloth of a soft non-woven (SUBA400 manufactured by Rodel, Inc.) or a pad of a soft urethane foaming body (UF manufactured by Rodel, Inc.). These members, however may comprise other materials.

The polishing pad 10A of this configuration is stuck to a rotating surface plate to polish a wafer, as in well-known pads. A polishing liquid supplied to the pad surface flows into the narrow grooves 14 cut throughout the pad surface in lattice-like form and permeates into the lower-layer member 12 through the narrow grooves 14 to diffuse quickly and evenly throughout the lower-layer member 12. Consequently, the polishing liquid permeates evenly and promptly throughout the pad to constantly maintain the elasticity of the pad 10A, thereby avoiding any local difference in compressibility caused by non-uniform permeation of the polishing liquid to provide a high polishing accuracy.

In particular, if the narrow grooves are cut in such a way as to reach the lower-layer member 12, the polishing liquid permeates directly into the lower-layer member 12 through the narrow grooves 14, so that permeation progresses promptly.

Additionally, the polishing liquid that has flowed into the narrow grooves 14 is held inside them and prevented from escaping despite the rotation of the surface plate. Thus, this invention provides an excellent ability to retain polishing materials and thus, an excellent polishing effect.

Figure 3:
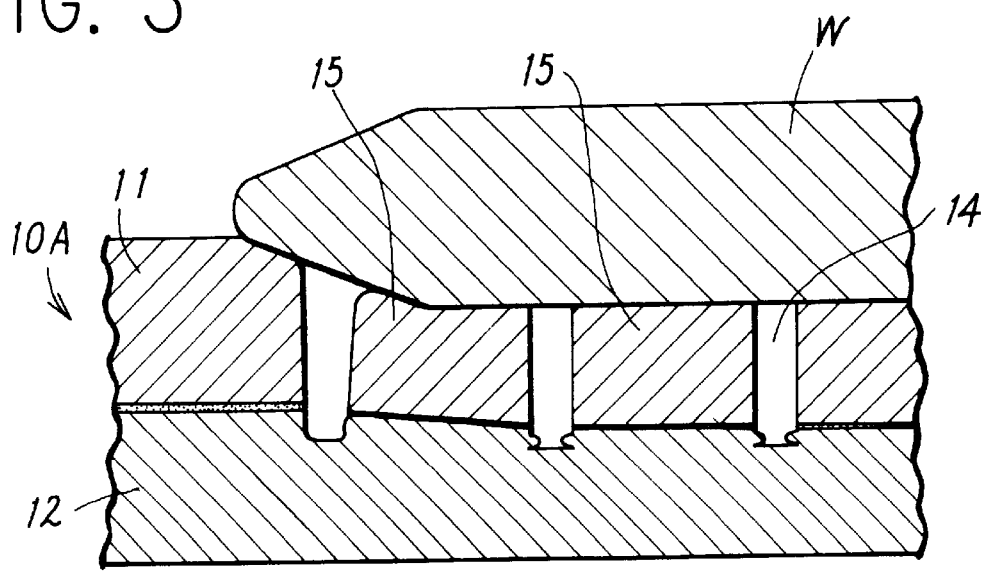
FIG. 3 is an enlarged sectional view of an integral part of this invention showing a wafer being polished by the polishing pad in FIG. 1.
Figure 6:
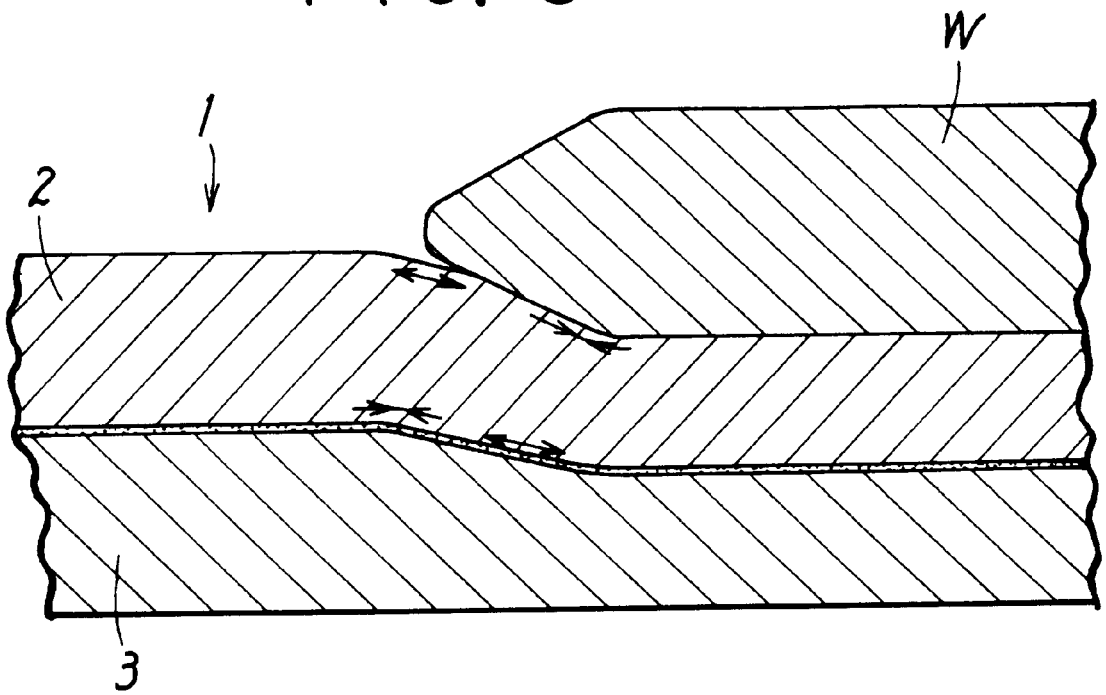
FIG. 6 is a enlarged sectional view of an integral part of this invention showing a wafer being polished by a conventional polishing pad.
Figure 7:
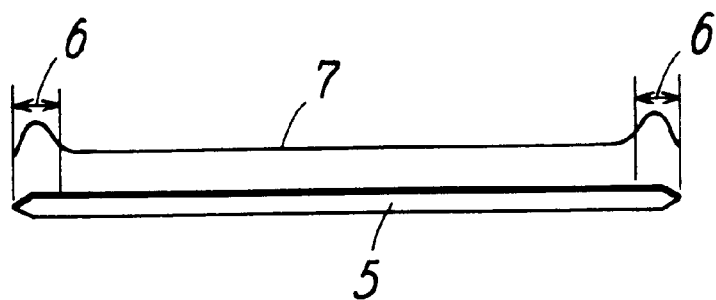
FIG. 7 is a side view showing a polished wafer and a distribution of film thickness.

In addition, since the pad surface is partitioned by the narrow grooves 14 into a plurality of small regions 15, the pad 1A can be locally deformed at the positions of the small regions 15. Accordingly, when the wafer W is pressed against the pad 10A as shown in FIG. 3, the portion of the small regions 15 that contact the wafer is locally compressed without interference from other portions and applies even contact pressure to the overall wafer. Thus, the wafer W is evenly polished up to its outer circumferential portion and the protective film is thicker only within a small area close to the outer circumference, thereby reducing the edge-exclusion zone 6 (see FIG. 6) and enhancing chip yields.

Additionally, the partitioning into the plurality of small regions 15 increases the flexibility of the pad 1A, which can thus be compressed and deformed appropriately at each small region 15 depending on the soft lower-layer member 12. Consequently, the adhesion of the pad 1A to the wafer W is increased to improve the uniformity of polishing.

In addition, if the pad surface is partitioned into a plurality of small regions in this manner, this increases the dependence of the compression and deformation of the pad on the soft lower-layer member through each small region 15. This allows the use of an upper-layer member 11 twice to four times thicker than the upper-layer member of the conventional polishing pad in order to reduce the frequency of pad replacement. That is, in general, if a polishing pad of a double-layer structure is used to polish a patterned wafer, the variation in the thickness of the upper-layer member that becomes worn as polishing progresses significantly affects the flatness of the wafer, so the pad must be replaced by a new one when the thickness of the hard upper-layer member has decreased by 0.3 mm to 0.5 mm. The configuration according to the above configuration allows the use of a thicker upper-layer member to substantially reduce the frequency of the replacement of the polishing pad.

Figure 4:
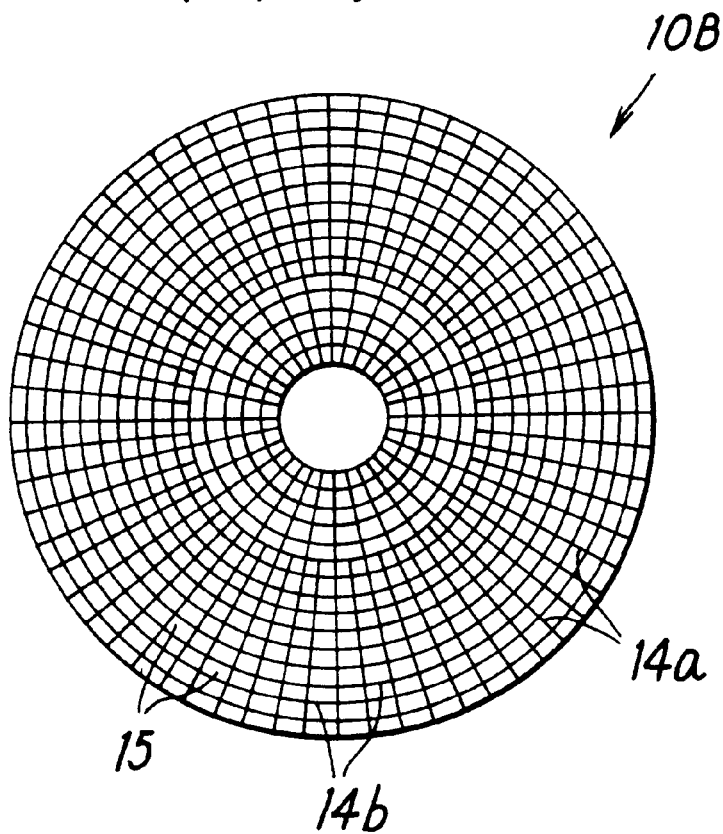
FIG. 4 is a top view showing a second embodiment of a polishing pad according to this invention.
Figure 5:
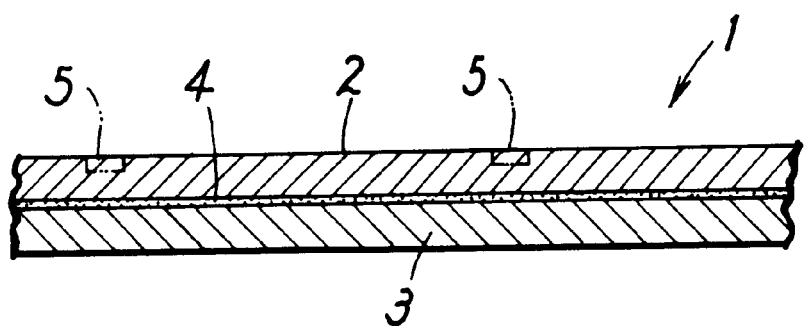
FIG. 5 is a sectional view of a conventional polishing pad.

FIG. 4 shows a second embodiment of this invention. In a pad 10B according to the second embodiment, the pad surface is partitioned into small fan-shaped regions 15 by forming radial narrow grooves 14a and concentric narrow grooves 14b. In this case, those small regions 15 which are located closer to the outer circumference are larger than the others, but even the largest regions are preferably formed in such a way that one side has a maximum length of 10 mm or less.

[Embodiments]

Next, an embodiment of this invention is described.

In the polishing pad used in this embodiment, the upper-layer member comprised a pad of a hard polyurethane foaming body (IC1000 (thickness: 1.27 mm) manufactured by Rodel, Inc.), and the lower-layer member comprised a pad of a soft urethane foaming body (UF (thickness: 1.27 mm) manufactured by Rodel, Inc.), and these members were adhered together using an epoxy adhesive. The narrow grooves formed in the pad surface each had a groove width of 1 mm and a groove pitch of 6 mm, the small region was shaped like a square of 5×5 mm, and the narrow grooves were 1.6 mm in depth.

The polishing pad was mounted on the surface plate of a single-side polishing machine, and a 6-inch orifice flange wafer having a thermally oxidized film on its surface was pressed against the pad surface while being held by a carrier and rotated. The polishing conditions are listed below.

Rate of rotation of polishing pad: 70 r.p.m
Rate of rotation of carrier: 59 r.p.m.
Working pressure: 0.5 Kg/cm$^2$
Flow of polishing liquid: 100 ml/min.
Polishing time: 2 min.

Based on the polishing rates obtained at 49 points on the wafer, the uniformity of the polished wafer surface was determined to be 5.13%, using the following equation. The length of the portion having greater film thickness (i.e., the edge-exclusion zone) at the outer circumference of the wafer was 3 mm.

$$\text{Uniformity} = \frac{\text{Polishing rate (maximum)} - \text{Polishing rate (minimum)}}{\text{Polishing rate (average)} \times 2}$$

On the other hand, as a comparative example, a double-layer pad consisting of a material similar to that in this invention and having no narrow grooves in the pad surface was used for similar polishing. In this latter case, wafer uniformity and the length of the edge-exclusion zone were about 10% and 5 mm, respectively.

These results show that the present pad improves uniformity while reducing the size of the edge-exclusion zone at the outer circumference to improve chip yield. It is also understandable that the improved uniformity allows polishing liquid to permeate evenly into the lower-layer member during polishing to maintain uniform pad compressibility.

As described above, this invention provides a polishing pad having a double layer consisting of a hard upper-layer member and a soft lower-layer member, wherein deep, narrow grooves are cut in the pad surface at small intervals. This configuration allows polishing liquid to permeate evenly into the lower-layer member through the narrow grooves, and the plurality of small regions partitioned among the narrow grooves improves the pad's deformation capability and flexibility so as to enable the wafer to be evenly polished up to the neighborhood of its outer circumference. This in turn improves polishing accuracy and reduces the size of the edge-exclusion zone at the wafer's outer circumference. In addition, the polishing liquid that has flowed into the narrow grooves is prevented from escaping despite the rotation of the surface plate, thus providing excellent retention ability for polishing materials and thus an excellent polishing effect.

What is claimed is:

1. A surface polishing pad formed of a hard upper-layer member having a lower compression rate and consisting of a material into which a polishing liquid can permeate, a soft lower-layer member having a higher compression rate and consisting of a material into which a polishing liquid can permeate, and an adhesive layer interposed between both members to adhere them together, wherein a plurality of narrow grooves for facilitating the permeation of polishing liquid into the lower-layer member and partitioning the surface of the pad into a plurality of small regions that can be locally deformed are cut in the pad surface at such an interval that the maximum length of one side of the small region is 10 mm or less and wherein the depth of said narrow grooves extend beyond the upper-layer member and adhesive layer and into the lower-layer member.

2. A pad according to claim 1 wherein the pad surface is partitioned into small rectangular regions by cutting said narrow grooves in a lattice-like form.

3. A pad according to claim 1 wherein the pad surface is partitioned into small fan-shaped regions by cutting the narrow grooves radially and concentrically.

4. A pad according to claim 1 wherein said adhesive layer consists of an urethane adhesive.

5. A pad according to claim 1 wherein said adhesive layer consists of an epoxy adhesive.

* * * * *